(12) United States Patent
Kocer et al.

(10) Patent No.: US 11,356,072 B2
(45) Date of Patent: Jun. 7, 2022

(54) CUSTOMIZABLE TUNABLE FILTERS

(71) Applicant: Analog Devices, Inc., Norwood, MA (US)

(72) Inventors: Fatih Kocer, Boxboro, MA (US); Ekrem Oran, Hollis, NH (US); Christopher O'Neill, Chelmsford, MA (US); Kasey Chatzopoulos, Londonderry, NH (US)

(73) Assignee: Analog Devices, Inc., Norwood, MA (US)

( * ) Notice: Subject to any disclaimer, the term of this patent is extended or adjusted under 35 U.S.C. 154(b) by 108 days.

(21) Appl. No.: 16/861,087

(22) Filed: Apr. 28, 2020

(65) Prior Publication Data

US 2021/0336597 A1 Oct. 28, 2021

(51) Int. Cl.
*H03H 7/01* (2006.01)

(52) U.S. Cl.
CPC ........ *H03H 7/0115* (2013.01); *H03H 7/0153* (2013.01); *H03H 2210/012* (2013.01)

(58) Field of Classification Search
CPC ........... H03H 7/0115; H03H 2210/012; H03H 7/0153
USPC .................................................. 333/175, 185
See application file for complete search history.

(56) References Cited

U.S. PATENT DOCUMENTS

| | | | |
|---|---|---|---|
| 3,678,416 A | 7/1972 | Burwen | |
| 4,710,974 A | 12/1987 | Kupfer | |
| 4,858,159 A | 8/1989 | Wheelwright et al. | |
| 5,999,429 A | 12/1999 | Brown | |
| 6,495,998 B1 | 12/2002 | Terreault | |
| 7,057,472 B2 | 6/2006 | Fukamachi et al. | |
| 8,957,738 B1 | 2/2015 | Koechlin et al. | |
| 9,000,851 B1 | 4/2015 | Oran et al. | |
| 9,123,983 B1 | 9/2015 | Oran | |
| 9,173,292 B1 | 10/2015 | Sokol et al. | |
| 9,520,356 B1 | 12/2016 | Chiesa et al. | |
| 9,543,921 B2 | 1/2017 | Kocer | |
| 2002/0045426 A1 | 4/2002 | Ogi et al. | |
| 2002/0186074 A1 | 12/2002 | Gorecki et al. | |

(Continued)

FOREIGN PATENT DOCUMENTS

| | | |
|---|---|---|
| DE | 10353866 A1 | 7/2005 |
| KR | 20160093768 A | 8/2016 |
| WO | WO 2017040223 A1 | 3/2017 |

OTHER PUBLICATIONS

Datasheet for AM35 EMI Filter Bank, Atlanta micro (Apr. 2019).
Datasheet for AM3034 Tunable Filter, Atlanta micro (Aug. 2020).
Datasheet for AM3108 Tunable Filter, Atlanta micro (Aug. 2018).
Datasheet for AM3089 Filter Bank, Atlanta micro (Jun. 2018).

(Continued)

*Primary Examiner* — Rakesh B Patel
(74) *Attorney, Agent, or Firm* — Knobbe, Martens, Olson & Bear, LLP

(57) ABSTRACT

Customizable tunable filters are provided herein. In certain implementations, a tunable filter including: a first filter bank including a plurality of high-pass filters each having a different cutoff frequency, and a second filter bank including a plurality of low-pass filters each having a different cutoff frequency. The tunable filter further includes a first pair of switches configured to select a first filter chosen from the first filter bank, and a second pair of switches configured to select a second filter chosen from the second filter bank. The tunable filter operates with a first cutoff frequency of the first filter and with a second cutoff frequency of the second filter.

20 Claims, 9 Drawing Sheets

(56) References Cited

U.S. PATENT DOCUMENTS

| | | |
|---|---|---|
| 2003/0143972 A1 | 7/2003 | Satoh |
| 2005/0184825 A1 | 8/2005 | Oran |
| 2009/0285135 A1 | 11/2009 | Rousu et al. |
| 2009/0286501 A1 | 11/2009 | Rousu et al. |
| 2011/0084767 A1 | 4/2011 | Kocer |
| 2011/0090014 A1 | 4/2011 | Kocer |
| 2011/0279176 A1 | 11/2011 | Oran |
| 2014/0340176 A1 | 11/2014 | Oran |
| 2017/0063411 A1* | 3/2017 | Ripley ................. H04B 1/1027 |
| 2018/0005966 A1 | 1/2018 | Smith et al. |
| 2020/0059219 A1* | 2/2020 | El-Hinnawy .......... H03H 11/04 |

OTHER PUBLICATIONS

Datasheet for AM3137 Filter Bank, Atlanta micro (Jan. 2019).

Gentili, Fabrizio, et al. "PIN-diode-based four-channel switched filter bank with low-power TTL-compatible driver." *IEEE transactions on microwave theory and techniques* 62.12 (2014): 3333-3340.

Guyette, Andrew C. "Intrinsically switched varactor-tuned filters and filter banks." *IEEE Transactions on Microwave Theory and Techniques* 60.4 (2012): 1044-1056.

Uher, Jaroslaw, et al. "Tunable microwave and millimeter-wave band-pass filters." *IEEE Transactions on Microwave Theory and Techniques* 39.4 (1991): 643-653.

Wong, Peng Wen, et al. "Electronically tunable filters." *IEEE Microwave Magazine* 10.6 (2009): 46-54.

PCT International Search Report received in PCT/US2021/027330 dated Aug. 4, 2021 in 3 pages.

PCT Written Opinion received in PCT/US2021/027330 dated Aug. 4, 2021 in 5 pages.

* cited by examiner

CUSTOMIZABLE TUNABLE FILTERS

FIELD OF THE DISCLOSURE

Embodiments of the invention relate to electronic systems, and more particularly to, customizable tunable filters which can be used, for example, in software defined radios.

BACKGROUND

Electronic systems can use tunable filters to adjust the frequencies filtered within a signal chain. Tunable filters can be used in a number of different applications, including, but not limited to, software defined radios and mixed signal front ends. In order to provide additional flexibility for a given application, it is desirable to provide more customization to tunable filters, thereby allowing the specific frequencies filtered by the tunable filter to be more precisely selected.

SUMMARY OF THE DISCLOSURE

Customizable tunable filters are provided herein. In one aspect, a tunable filter with controllable cutoff frequencies, wherein the tunable filter comprises: a first filter bank including a plurality of high-pass filters each having a different cutoff frequency; a second filter bank including a plurality of low-pass filters each having a different cutoff frequency; a first pair of switches configured to select a first filter chosen from the first filter bank; and a second pair of switches configured to select a second filter chosen from the second filter bank, wherein the tunable filter operates with a first cutoff frequency of the first filter and with a second cutoff frequency of the second filter.

In another aspect, a method of tunable filtering, the method comprising: selecting a first filter from a first filter bank of a tunable filter using a first pair of switches of the tunable filter, the first filter bank comprising a plurality of high-pass filters; and selecting a second filter from a second filter bank of the tunable filter using a second pair of switches of the tunable filter, the second filter bank comprising a plurality of low-pass filter; and filtering a radio frequency signal using the tunable filter, wherein the filtering is based on a first cutoff frequency of the first filter and on a cutoff frequency of the second filter.

In yet another aspect, a radio frequency (RF) module comprising: a module substrate; and a semiconductor die attached to the module substrate, wherein the semiconductor die comprises: a first filter bank including a plurality of high-pass filters each having a different cutoff frequency; a second filter bank including a plurality of low-pass filters each having a different cutoff frequency; a first pair of switches configured to select a first filter chosen from the first filter bank, wherein the first filter has a first cutoff frequency; and a second pair of switches configured to select a second filter chosen from the second filter bank, wherein the second filter has a second cutoff frequency.

DETAILED DESCRIPTION

Figure 1:
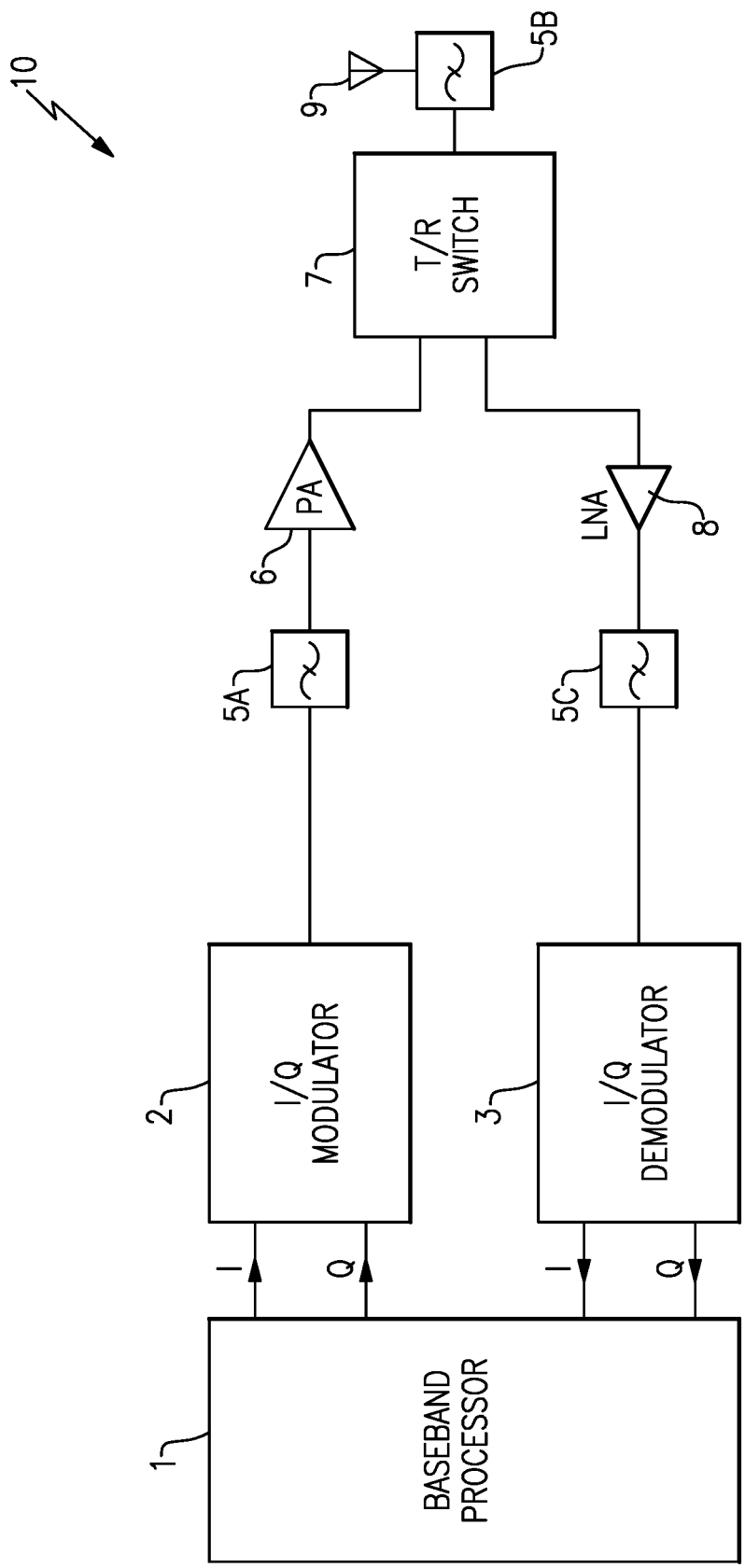
FIG. 1 is a schematic diagram of one example of an RF communication system that can include one or more tunable filters in accordance with the teachings herein.

The following detailed description of embodiments presents various descriptions of specific embodiments of the invention. In this description, reference is made to the drawings in which like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Introduction to RF Communication Systems

A radio frequency (RF) communication system communicates by wirelessly transmitting and receiving RF signals. Such RF communication systems can include one or more filters to filter out (e.g., attenuate) a fixed set of frequencies from a signal while allowing the remaining frequencies to pass the filter. Examples of filters include, but are not limited to, low-pass filters, high-pass filters, and band pass filters.

Although the filters used in an RF communication system may be implemented to filter a fixed set of frequencies, for certain applications it is desirable to use tunable filters in which the set of filtered frequencies can be selected. For example, such configurability can allow channel or band selection and/or provide adjustment to filter corner frequencies.

It also desirable for the filters of an RF communication system to be integrated on-chip with other components of the system, such as switches, attenuators, and/or amplifiers. For example, integrated filters can reduce total area and cost of the system and/or result in shorter connections between components to achieve lower insertion loss. Moreover, integrating filters on-chip facilitates ease of configuring the filters, since filter control circuitry can be readily fabricated on the chip alongside the filters and/or data for configuring the filters can be provided by way of pins of the chip (for instance, using a serial interface or bus).

In contrast, certain filters, such as acoustic filters and passive filters implemented with surface mount devices (SMDs), suffer from limited or no configurability and/or are unable to be integrated on-chip with other components of the RF communication system.

The tunable filters herein can provide filtering to signals of a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The RF signals filtered by the tunable filters can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

FIG. 1 is a schematic diagram of one example of an RF communication system 10 that can include one or more tunable filters 5A-5C implemented in accordance with the teachings herein.

Although, the RF communication system 10 illustrates one example of an electronic system that can include one or more tunable filters 5A-5C as described herein, tunable filters 5A-5C can also be used in other configurations of electronic systems.

Furthermore, although a particular configuration of components is illustrated in FIG. 1, the RF communication system 10 can be adapted and modified in a wide variety of ways. For example, the RF communication system 10 can include more or fewer receive paths and/or transmit paths. Additionally, the RF communication system 10 can be modified to include more or fewer components and/or a different arrangement of components, including, for example, a different arrangement of RF switching circuits, amplifiers, and/or filters.

In the illustrated configuration, the RF communication system 10 includes a baseband processor 1, an I/Q modulator 2, an I/Q demodulator 3, a first tunable filter 5A, a power amplifier 6, a transmit/receive (T/R) switch 7, a low noise amplifier (LNA) 8, an antenna 9, a second tunable filter 5B, and a third tunable filter 5C. Although the first to third tunable filters 5A-5C are each described as being tunable filters, in certain implementations, one of more of the first to third tunable filters 5A-5C may be implemented as a non-tunable filter in certain embodiments and/or omitted. Furthermore, other placements of tunable filter(s) in transmit and/or receives paths of the RF communication system 10 are possible.

As shown in FIG. 1, baseband processor 1 generates an in-phase (I) transmit signal and a quadrature-phase (Q) transmit signal, which are provided to the I/Q modulator 2. Additionally, the baseband processor 1 receives an I receive signal and a Q receive signal from the I/Q demodulator 3. The I and Q transmit signals correspond to signal components of a transmit signal of a particular amplitude, frequency, and phase. For example, the I transmit signal and Q transmit signal represent an in-phase sinusoidal component and quadrature-phase sinusoidal component, respectively, and can be an equivalent representation of the transmit signal. Additionally, the I and Q receive signals correspond to signal components of a receive signal of a particular amplitude, frequency, and phase.

In certain implementations, the I transmit signal, the Q transmit signal, the I receive signal, and the Q receive signal are digital signals. Additionally, the baseband processor 1 can include a digital signal processor, a microprocessor, or a combination thereof, used for processing the digital signals.

The I/Q modulator 2 receives the I and Q transmit signals from the baseband processor 1 and processes them to generate a modulated RF signal. In certain configurations, the I/Q modulator 2 can include DACs configured to convert the I and Q transmit signals into an analog format, mixers for upconverting the I and Q transmit signals to radio frequency, and a signal combiner for combining the upconverted I and Q signals into the modulated RF signal.

The first tunable filter 5A receives the modulated RF signal from the I/Q modulator 2, and provides a filtered RF signal to an input of the power amplifier 6. In certain configurations, the first tunable filter 5A can implement a band pass filter configured to provide band filtering, with the lower and upper cutoff frequencies of the band pass being tunable based on an input signal received by the first tunable filter 5A. In some implementations, the first tunable filter 5A can also be configured to implement a low-pass filter, a band pass filter, a notch filter, a high-pass filter, or a combination thereof, based on the input signal, each of which may include tunable cutoff frequencies. Thus, the particular set of frequencies filtered by the first tunable filter 5A can be adjusted using the input signal applied to the first tunable filter 5A.

The power amplifier 6 can amplify the filtered RF signal to generate an amplified RF signal, which is provided to the transmit/receive switch 7. The transmit/receive switch 7 is further electrically connected to the second tunable filter 5B and to an input of the low noise amplifier 8. The second tunable filter 5B is connected to the antenna 9. Thus, in this example, the power amplifier 6 provides the amplified RF signal to the antenna 9 by way of the transmit/receive switch 7 and the second tunable filter 5B. However, other implementations are possible, such as configurations in which the second tunable filter 5B is omitted.

In certain configurations, the second tunable filter 5B can be configured to operate similarly to the first tunable filter 5A, for example, by selectively implementing a band pass filter, a low-pass filter, a notch filter, a high-pass filter, or a combination thereof, based on an input signal received at the second tunable filter 5B, each of which may include tunable cutoff frequencies. Thus, the particular set of frequencies filtered by the second tunable filter 5B can be adjusted using the input signal applied to the first tunable filter 5A.

The transmit/receive switch 7 can be used to selectively connect the antenna 9 (via the second tunable filter 5B) to the output of the power amplifier 6 or to the input of the low noise amplifier 8. In certain implementations, the transmit/receive switch 7 can provide a number of other functionalities, including, but not limited to, band switching and/or switching between different power modes.

The LNA 8 receives an antenna receive signal from the transmit/receive switch 7, and generates an amplified antenna receive signal that is provided to the third tunable filter 5C, which is configured to filter the receive signal and provide the filtered receive signal to the I/Q demodulator 3.

In certain configurations, the third tunable filter 5C can be configured to operate similarly to the first tunable filter 5A, for example, by selectively implementing a band pass filter, a low-pass filter, a notch filter, a high-pass filter, or a combination thereof, based on an input signal received at the third tunable filter 5C, each of which may include tunable cutoff frequencies. Thus, the particular set of frequencies filtered by the third tunable filter 5C can be adjusted using the input signal applied to the first tunable filter 5A.

The I/Q demodulator 3 can be used to generate the I receive signal and the Q receive signal, as was descried above. In certain configurations, the I/Q demodulator 3 can include a pair of mixers for mixing the attenuated receive signal with a pair of clock signals that are about ninety degrees out of phase. Additionally, the mixers can generate downconverted signals, which can be provided to ADCs used to generate the I and Q receive signals.

Tunable Filters

As described above, filters can be used in many different electronic systems, and traditionally are configured to filter out (e.g., attenuate) a fixed set of frequencies from a signal while allowing the remaining frequencies to pass the filter. A tunable filter may be a filter having certain parameters which can be adjusted, for example, based on input control signals.

For example, a tunable filter may be adjustable by selecting the filter type (e.g., whether the tunable filter functions as a low-pass, high-pass, band-pass, all-pass, no-pass, etc. filter) and/or the cutoff frequencies associated with the selected filter. In another example, the tunable filter the amount of attenuation to out-of-band signals and/or an insertion loss of the tunable filter is adjustable.

Tunable filters can be used as components in building electronics systems. For example, tunable filters can be used within an RF signal chain, such as the tunable filters 5A-5C shown in FIG. 1. Another example electronic system which can be enabled using tunable filters is a software-defined radio. Software-defined radio can include one or more components which were traditionally implemented in hardware instead implemented in software. Tunable filters can also be used as part of a mixed signal front end (MxFE), which can be used in, for example, wideband networking applications.

Aspects of this disclosure relate to tunable filters which can be tuned to filter a selected set of frequencies based on an input control signal, which can be analog, digital, or a combination thereof. In one example, one or more tunable filters are fabricated on a semiconductor die, and the tunable filter(s) are programmed by way of filter control data provided to the semiconductor die over a serial interface or bus.

In certain embodiments, a tunable filter includes an RF input terminal, an RF output terminal, a bank of selectable high-pass filters, and a bank of selectable low-pass filters connected in series with the bank of selectable high-pass filters between the RF input terminal and the RF output terminal. The bank of selectable high-pass filters includes an arrangement of high-pass filters in parallel and that are individually selectable, while the selectable low-pass filter includes an arrangement of low-pass filters in parallel and that are individually selectable. Additionally, a desired high-pass filter and a desired low-pass filter can be chosen from the banks based on an input control signal, thereby achieving a desired filter function. In certain implementations, at least a portion of the selectable high-pass filters and/or at least a portion of the selectable low-pass filters are individually configurable (for instance, tunable and/or programmable) to provide an additional layer of flexibility in achieving desired filter characteristics.

Each of the selectable high-pass filters can have different filtering characteristics (for instance, cutoff frequencies, out-of-band attenuation, and/or insertion loss) to provide a wide range of available high-pass filtering characteristics. Likewise, each of the selectable low-pass filters can have different filtering characteristic to provide a wide range of available low-pass filtering characteristics.

In certain implementations, the bank of selectable high-pass filters and/or the bank of selectable low-pass filters includes a bypass path to aid in providing an option for an all-pass filter response (by bypassing both filter banks), a low-pass filter response (by bypassing all the high-pass filters), or a high-pass filter response (by bypassing all the low-pass filters). Furthermore, the tunable filter can be implemented with an option to select no high-pass filters and no low-pass filters, thereby providing a no pass response when desired. This could also be achieved by setting the corner frequencies of high-pass and low-pass filters in such a way that their pass-bands do not intersect, achieving a no-pass (all reject) response.

The bank of selectable high-pass filters and the bank of selectable low-pass filters can be in either order, for instance, with the bank of selectable high-pass filters closest to the RF input terminal or with the bank of selectable low-pass filters closest to the RF input terminal.

In certain implementations, the tunable filter includes a pair of single pole multi throw (SPnT) switches, and the bank of selectable high-pass filters includes a plurality of high-pass filters each connected between a corresponding pair of throws of the switches. Furthermore, a bypass path is included in some implementations between a pair of throws. One or more of the high-pass filters can be configurable to further enhance flexibility. For instance, in one example one or more of the high-pass filters include inductor(s) and/or capacitor(s) connected as resonator(s), with either an inductance of the inductor(s) and/or a capacitance of the capacitor(s) being controllable.

Such control over individual high-pass filters can be used not only to tune the selected high-pass filter chosen by the switches, but also to tune one or more unselected filters. For example, the single pole multi throw switches suffer from finite isolation, and thus a portion of the RF signal can leak into unselected filter paths. By tuning one or more unselected filters (for instance, away from the corner frequency of a selected high-pass filter), isolation issues such as reentry can be mitigated.

In certain implementations, tuning filter includes another pair of single pole multi throw switches, and the bank of selectable low-pass filters includes a plurality of low-pass filters each connected between a corresponding pair of throws of the additional pair of switches. Furthermore, a bypass path is included in some implementations between a pair of throws. One or more of the low-pass filters can be configurable to further enhance flexibility. Such individual configurability of the low-pass filters can be applied to selected and/or unselected filters.

Figure 2:
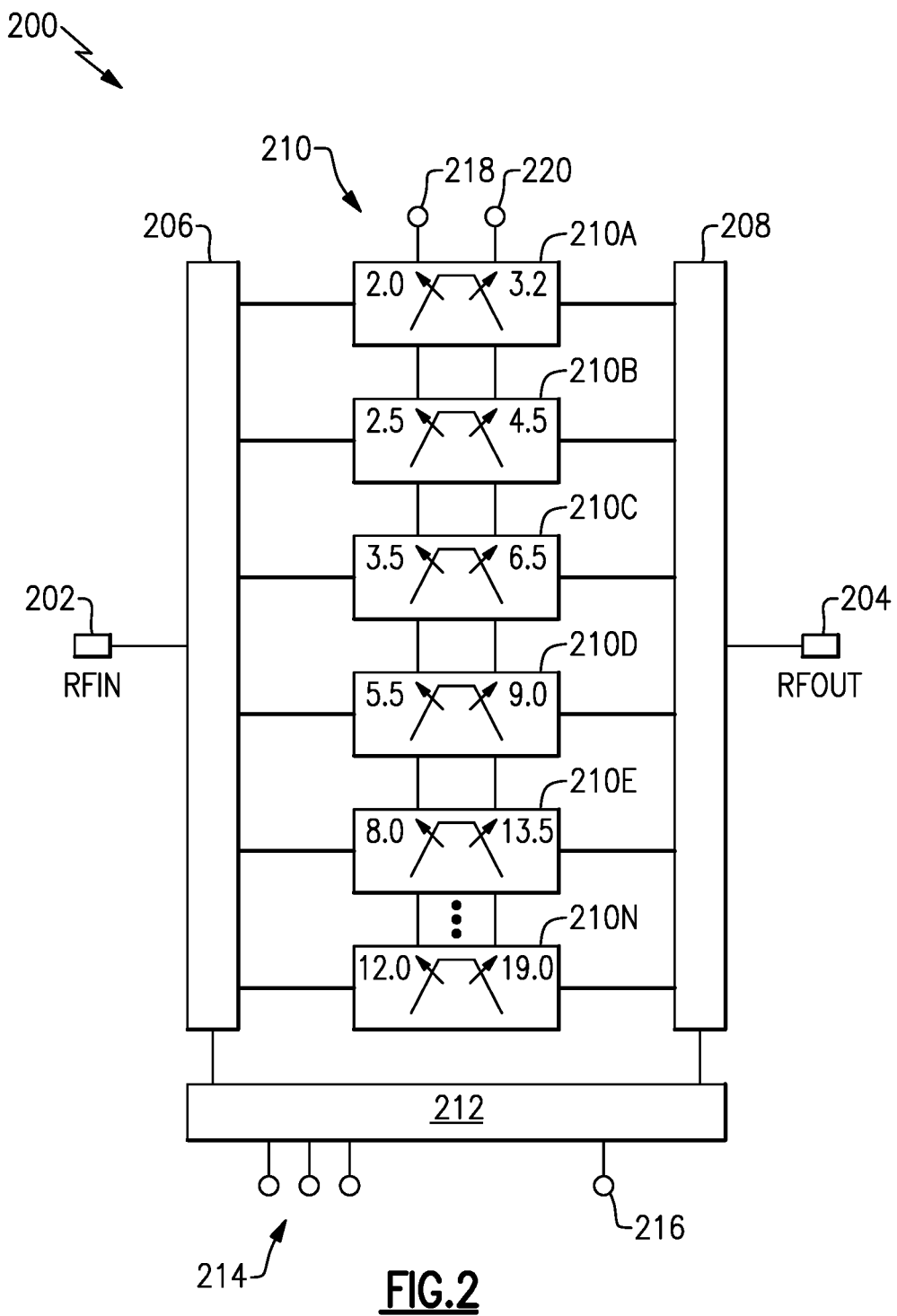
FIG. 2 is a diagram of an example of a tunable filter.

FIG. 2 is a diagram of an example of a tunable filter 200. The tunable filter 200 includes a radio frequency (RF) input (RFIN) 202, an RF output (RFOUT) 204, a first switch 206, a second switch 208, a bank of filters 210, and logic circuitry 212. The logic circuitry 212 can be configured to receive an input signal from one or more input pins 214 and power supply/ground voltage from one or more power supply pins 216 in order to power the logic circuitry 212.

The filter bank 210 includes a plurality of filters 210A, 210B, 210C, 210D, 210E, . . . 210N. Although the illustrated filter bank 210 includes six filters 210A-210N, the filter bank 210 can include two or more filters 210A-210N, depending on the implementation. Each of the filters 210A-210N is implemented as a band-pass filter having a lower cutoff frequency and an upper cutoff frequency.

The logic circuitry 212 can be configured to select one of the filters 210A-210N based on the input signal received via the one or more input pins 214. The first switch 206 and the second switch 208 can be implemented as single pole multi-throw (SPnT) switches, enabling the RF input 202 and the RF output 204 to be connected to one of the filters 210A-210N at a time. In particular, the logic circuitry 212 can be configured to connect one of the filters 210A-210N to the RF input 202 and the RF output 204 by connecting the first switch 206 and the second switch 208 to the one of the filters 210A-210N indicated by the input signal.

In one example, the filter bank 210 can include six band-pass filters having respective cutoff frequencies as illustrated in FIG. 2. For example, the first filter 210A may have a lower cutoff frequency of 2.0 GHz and an upper cutoff frequency of 3.2 GHz, the second filter 210B may have a lower cutoff frequency of 2.5 GHz and an upper cutoff frequency of 4.5 GHz, the third filter 210C may have a lower cutoff frequency of 3.5 GHz and an upper cutoff frequency of 6.5 GHz, the fourth filter 210D may have a lower cutoff frequency of 5.5 GHz and an upper cutoff frequency of 9.0 GHz, the fifth filter 210E may have a lower cutoff frequency of 8.0 GHz and an upper cutoff frequency of 13.5 GHz, and the sixth filter 210N may have a lower cutoff frequency of 12.0 GHz and an upper cutoff frequency of 19.0 GHz.

Each of the filters 210A-210N may also be connected to a lower cutoff frequency tuning input 218 and an upper cutoff frequency tuning input 220. The tuning signals applied to the filters 210A-210N may collectively tune the lower and upper cutoff frequencies of the filters 210A-210N within a certain range, allowing for addition tuning of the overall tunable filter 200 beyond the respective cutoff frequencies annotated on the filters 210A-210N from the filter bank 210. However, the tuning signals are common across the filters 210A-210N, and thus there may be a limit to the amount of tuning possible using the tuning signals applied to the lower cutoff frequency tuning input 218 and an upper cutoff frequency tuning input 220.

For instance, in the example described in connection with FIG. 2, it may not be possible to provide a band-pass filter having a lower cutoff frequency of 2.0 GHz and an upper cutoff frequency of 19.0 GHz since each of the individual cutoff frequencies may only be tunable within a certain range (e.g., ±1.0 GHz).

Furthermore, the depicted tunable filter 200 is unable to provide low-pass, high-pass, or all pass responses. Thus, there may be limits to the amount of customization of the tunable filter 200 illustrated in FIG. 2.

Figure 3:
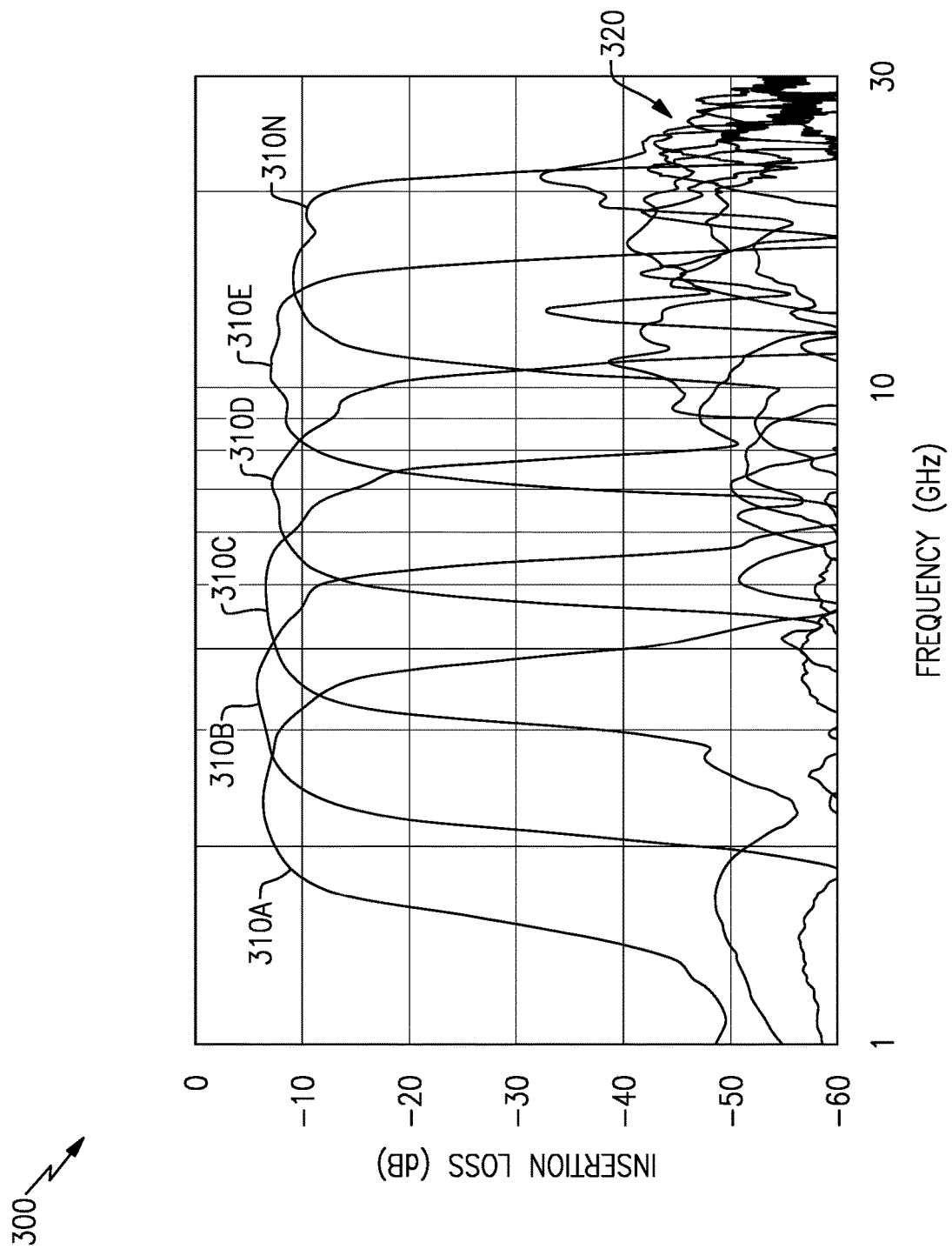
FIG. 3 is a graph illustrating the frequency response of the tunable filter of FIG. 2.

FIG. 3 is a graph 300 illustrating the frequency response of the tunable filter 200 of FIG. 2. In particular, the graph 300 of FIG. 3 shows the frequency responses 310A, 310B, 310C, 310D, 310E, and 310N for each of the filters 210A-210N of the tunable filter 200 illustrated in FIG. 2.

Figure 4:
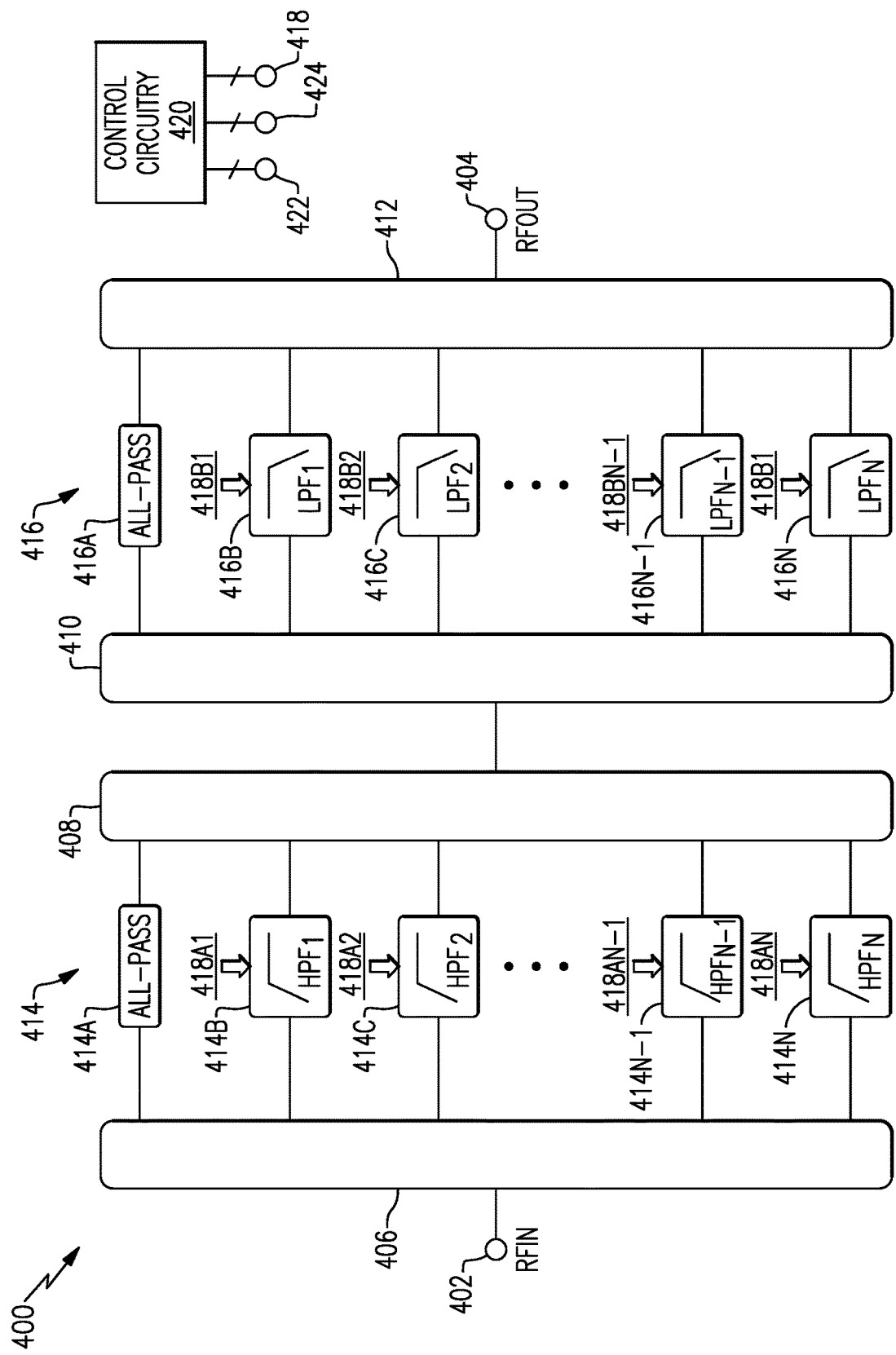
FIG. 4 is a diagram of an embodiment of a tunable filter in accordance with aspects of this disclosure.

FIG. 4 is a diagram of an embodiment of a tunable filter 400 in accordance with aspects of this disclosure. The tunable filter 400 includes an RF input (RFIN) 402, an RF output (RFOUT) 404, a first pair of switches 406 and 408, a second pair of switches 410 and 412, a first filter bank 414, a second filter bank 416, and control circuitry 420.

The control circuitry 420 can be configured to receive an input signal from one or more input pins 422 and generate one or more switch control signals for setting the state of the switches. Thus, the control circuitry 420 can output the switch control signal(s) from one or more switch control output pins 424 to control the selected paths chosen by the first and second pairs of switches 406-412.

With continuing reference to FIG. 4, the control circuitry 420 can further be configured to generate one or more filter tuning control signals and output the filter tuning control signal(s) 418 via one or more filter tuning output pins to control the filter banks 414 and 416. Depending on the embodiment, the control signal(s) may be implemented as analog signals (for instance, for tuning varactors) and/or digital signals (for instance, for setting a capacitance value of capacitor bank and/or an inductance value of an inductor bank).

Although FIG. 4 illustrates the tunable filter as including the control circuitry 420, in some implementations, the tunable filter 400 may not include the control circuitry 420 and instead receive control signals (for instance, by way of pins of a chip on which the tunable filter 400 is fabricated) for controlling the first and second pairs of switches 406-412 and tuning each of the filters in the first and second filter banks 414 and 416 from an external source.

The first filter bank 414 includes a plurality of filters including an all-pass filter 414A (for instance, a bypass path implemented as a conductor) and a plurality high-pass filters 414B, 414C, . . . , 414N−1, and 414N. Each of the high-pass filters 414B-414N may have a cutoff frequency at a different frequency. Similarly, the second filter bank 416 includes a plurality of filters including an all-pass filter 416A and a plurality of low-pass filters 416B, 416C, . . . , 416N−1, and 416N. Each of the low-pass filters 416B-416N may have a cutoff frequency at a different frequency.

The control circuitry 420 can be configured to select one of the filters 414A-414N from the first filter bank 414 and one of the filters 416A-416N from the second filter bank 416 based on the input signal received via the one or more input pins 422. For example, the control circuitry 420 can output first switch control signals via the one or more switch control output pins 424 to the first pair of switches 406 and 408 to select a filter from the first filter bank 414 and second switch control signals via the one or more switch control output pins 424 to the second pair of switches 410 and 412 to select a filter from the second filter bank 416.

Each of the switches 406-412 can be implemented as single pole multi-throw (SPnT) switch, enabling the first pair of switches 406 and 408 to select a filter from the first filter bank 414 and the second pair of switches 410 and 412 to select a filter from the second filter bank 416. In this way, any combination of a first filter from the first filter bank 414 and a second filter from the second filter bank 416 can be connected between the RF input 402 and the RF output 404.

Using the configuration of the tunable filter 400 illustrated in FIG. 4, the tunable filter 400 can be configured to provide any one of the following: a bandpass response with tunable bandwidth, a low-pass response with tunable bandwidth, a high-pass response with tunable bandwidth, an all-pass response, or an all-reject response. For example, the tunable filter 400 can provide a low-pass filter response by selecting the all-pass filter 414A and one of the low-pass filters 416B-416N. The tunable filter 400 can provide a high-pass response by selecting one of the high-pass filters 414B-414N and the all-pass filter 416A. The tunable filter 400 can provide an all-pass response by selecting the all-pass filters 414A and 416A. The tunable filter 400 can provide a band-pass filter response by selecting one of the high-pass filters 414B-414N and one of the low-pass filters 416B-416N, where the lower cutoff frequency of the selected high-pass filter 414B-414N is less than the upper cutoff frequency of the selected low-pass filter 416B-416N. The tunable filter 400 can provide an all-reject response by selecting one of the high-pass filters 414B-414N and one of the low-pass filters 416B-416N, where the lower cutoff frequency of the selected high-pass filter 414B-414N is greater than the upper cutoff frequency of the selected low-pass filter 416B-416N.

The cutoff frequencies of each of the selected filter responses can also be selected by selecting the appropriate pair of the filters from the filter banks 414 and 416. That is, each of the high-pass filters 414B-414N may have a different lower cutoff frequency, such that the desired lower cutoff frequency can be selected by selecting the appropriate one of the high-pass filters 414B-414N. Similarly, each of the low-pass filters 416B-416N may have a different upper cutoff frequency, such that the desired upper cutoff frequency can be selected by selecting the appropriate one of the low-pass filters 416B-416N.

In addition, each of the high-pass filters 414B-414N and the low-pass filters 416B-416N may also be individually tunable using the filter tuning control signals 418 applied via the one or more filter tuning output pins. For example, the filter tuning control signals 418 can include filter tuning control signals 418A1, 418A2, . . . 418AN−1, and 418AN respectively applied to the high-pass filters 414B-414N and filter tuning control signals 418B1, 418B2, . . . 418BN−1, and 418BN respectively applied to the low-pass filters 416B-416N. Thus, each of the high-pass and low-pass filters 414B-414N and 414B-414N can receive an individual filter tuning control signal 418A1-418AN, 418B1-418BN via one of the filter tuning output pins. Accordingly, the control circuitry 420 can individually tune the selected filters from the filter banks 414 and 416 to achieve the desired cutoff frequencies.

In certain implementations, the control circuitry 420 can also be configured to tune the unselected filters 414B-414N and 416B-416N from the filter banks 414 and 416 away from the cutoff frequency of the selected filters 414B-414N and 416B-416N. For example, the components of the filters 414B-414N and 416B-416N may cause reentry noise on the selected filters 414B-414N and 416B-416N. Reentry noise can refer to noise occurring in the out of band frequencies, which can negatively affect the performance of the tunable filter. FIG. 3 illustrates reentry noise 320 which can occur in a tunable filter 200 or 400.

The amount of reentry noise cause by the unselected filters 414B-414N and 416B-416N may be dependent on the cutoff frequencies of the unselected filters 414B-414N and 416B-416N. That is, as the cutoff frequencies of the unselected filters 414B-414N and 416B-416N approaches to the cutoff frequencies of the selected filters 414B-414N and 416B-416N, the amount of reentry noise may increase. Therefore, the control circuitry 420 can be configured to tune the cutoff frequencies of the unselected filters 414B-414N and 416B-416N away from the cutoff frequency of the selected filters 414B-414N and 416B-416N in order to reduce reentry noise in the frequency response of the tunable filter 400.

Figure 5:
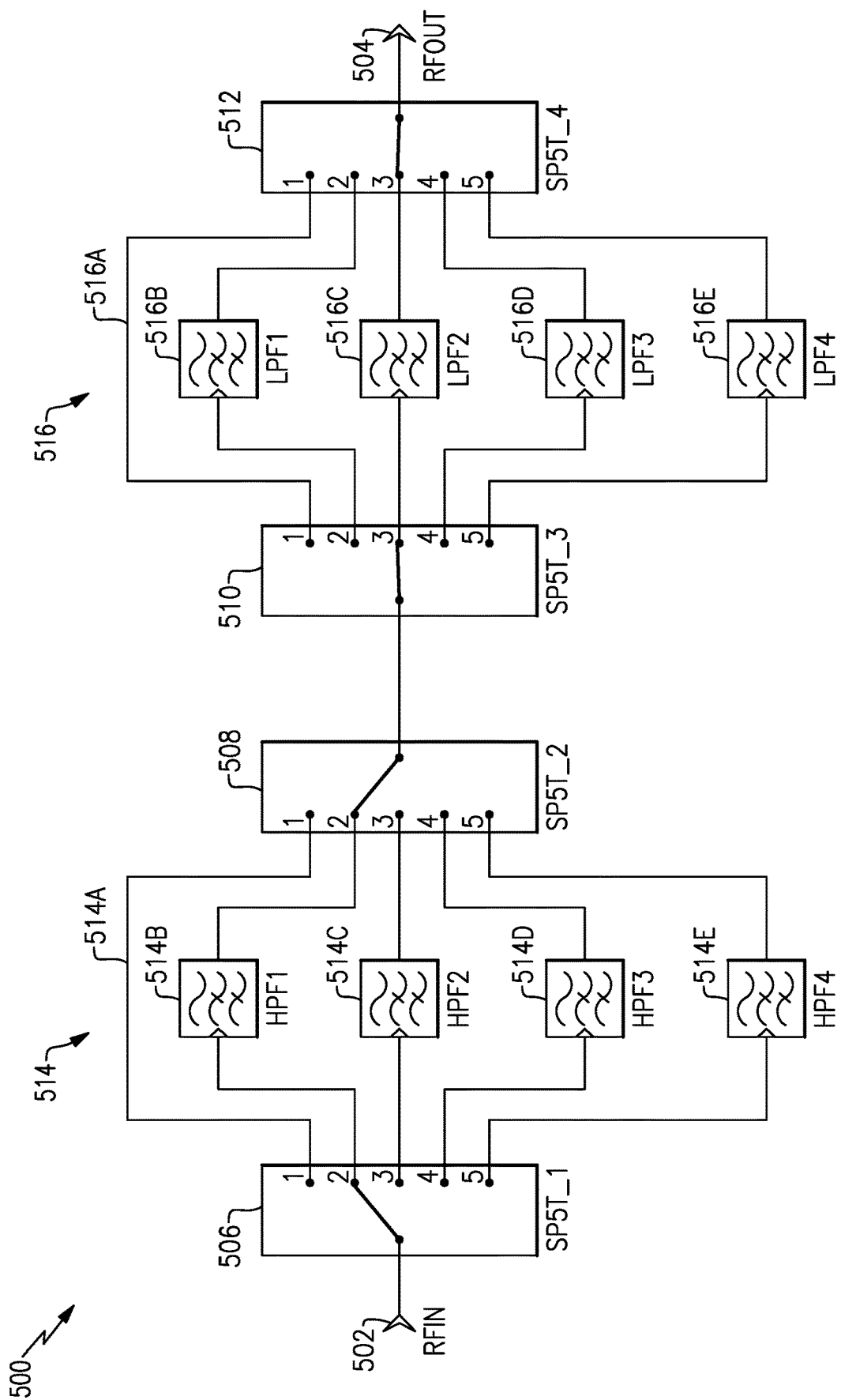
FIG. 5 illustrates an example tunable filter configured to provide a band-pass filter response in accordance with aspects of this disclosure.
Figure 6:
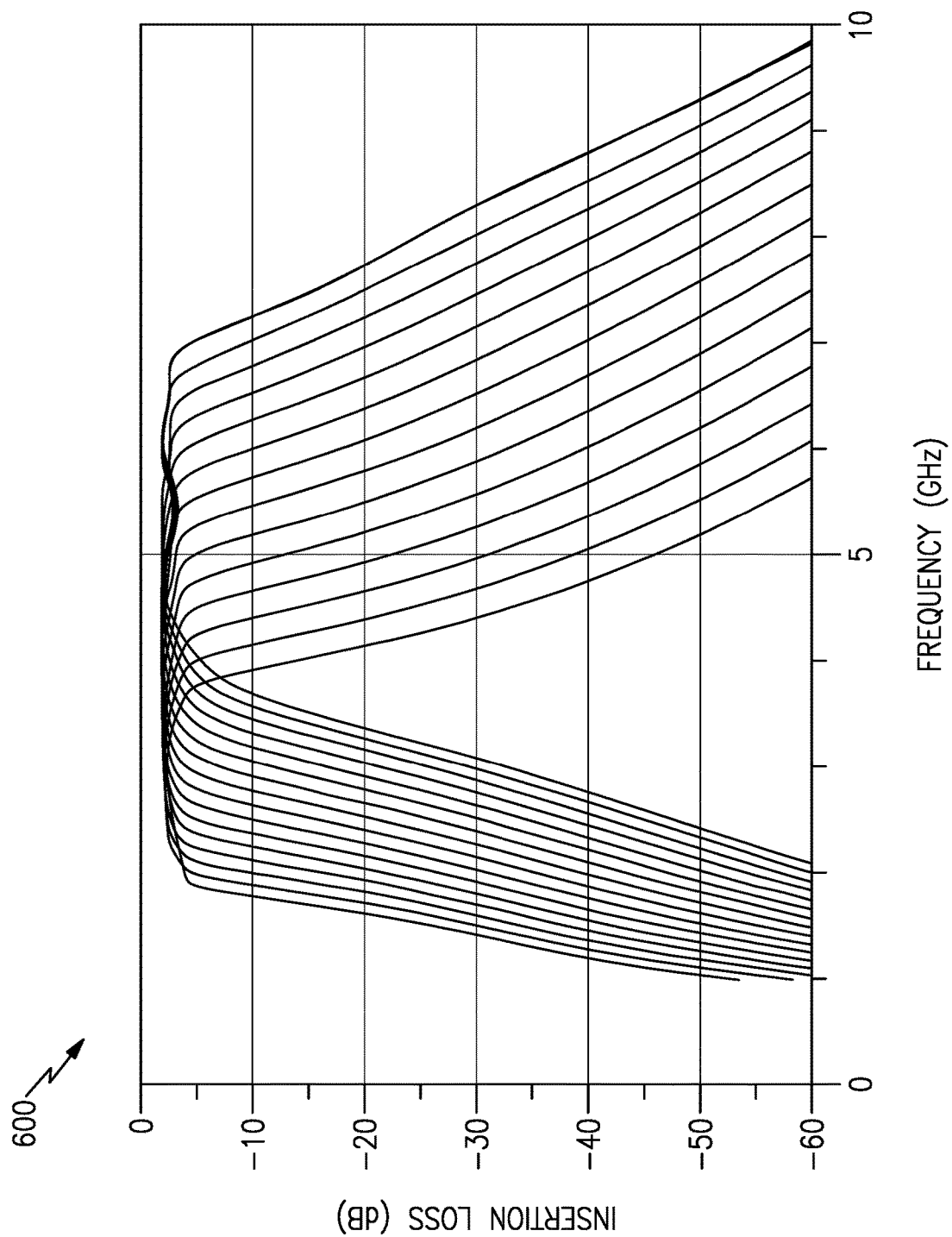
FIG. 6 illustrates a number of different band-pass responses that can be provided by individually tuning the cutoff frequencies of the high-pass filter and the low-pass filter of the tunable filter of FIG. 5.

FIG. 5 illustrates an example tunable filter 500 configured to provide a band-pass filter response in accordance with aspects of this disclosure. FIG. 6 is a graph 600 illustrating the frequency response of the tunable filter 500 in the configuration illustrated in FIG. 5 in accordance with aspects of this disclosure.

The tunable filter 500 includes an RF input (RFIN) 502, an RF output (RFOUT) 504, a first pair of switches 506 and 508, a second pair of switches 510 and 512, a first filter bank 514, and a second filter bank 516. Although not illustrated, the tunable filter 500 may also include control circuitry configured to provide control signals to the switches 506-412 and the filter banks 514 and 516, similar to the control circuitry 420 of FIG. 4.

The first filter bank 514 includes a plurality of filters including an all-pass filter 514A and a plurality high-pass filters 514B, 514C, 514D, and 514E, while the second filter bank 516 includes a plurality of filters including an all-pass filter 516A and a plurality of low-pass filters 516B, 516C, 516D, and 516E. Each of the high-pass filters 514B-514E and the low-pass filters 516B516E may have a cutoff frequency at a different frequency, which may be tunable. In the configuration illustrated in FIG. 5, the first pair of switches are connected to the high-pass filter 514B and the second pair of switches are connected to the low-pass filter 516C such that the tunable filter 500 has a band-pass response.

FIG. 6 illustrates a number of different band-pass responses that can be provided by individually tuning the cutoff frequencies of the high-pass filter 514B and the low-pass filter 516C of the tunable filter 500 of FIG. 5. As shown in FIG. 6, the band-pass response of the tunable filter 500 can be adjusted to provide a wide range of band-pass responses by tuning the cutoff frequencies of the high-pass filter 514B and the low-pass filter 516C. When different filters are selected from the first and second filter banks 514 and 516, the cutoff frequencies of the selected filters can also be tuned to provide a wide range of customizability to the tunable filter 500.

Figure 7:
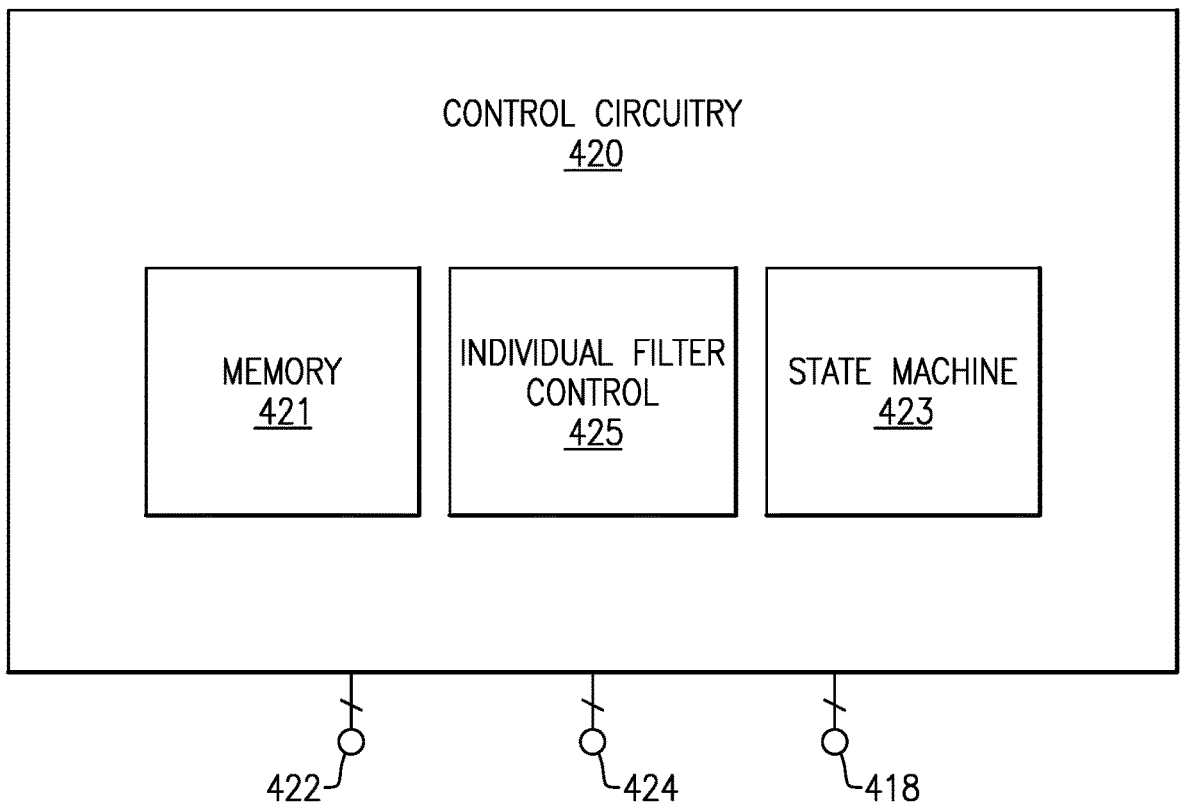
FIG. 7 is an example embodiment of control circuitry that can be used in the tunable filter of FIG. 4.

FIG. 7 is an example embodiment of control circuitry 420 that can be used in the tunable filter 400 of FIG. 4. As described above in connection with FIG. 4, the control circuitry 420 can be configured to receive an input signal from one or more input pins 422 and generate one or more switch control signals. The control circuitry 420 can output the switch control signal(s) from one or more switch control output pins 424 to control the first and second pairs of switches 406-412. The control circuitry 420 can further be configured to generate one or more filter tuning control signals and output the filter tuning control signal(s) 418 via one or more filter tuning output pins to control the filter banks 414 and 416.

As shown in FIG. 7, the control circuitry 420 can include a memory 421, a state machine 423, and individual filter control circuitry 525 for generating filter tuning control signal(s).

In certain embodiments a tunable filter 400 may be used as part of a frequency-hopping spread spectrum (FHSS) system. In an FHSS system, the system may rapidly change the carrier frequency from among may different frequencies within a large band. When included in an FHSS system, the tunable filter 400 may also be required to switch between various different filters having different filter parameters (e.g., between filters having specific cutoff frequencies and pass-bands). If the set of filters required for a certain application are defined, the memory 421 can be programmed with the parameters required for implementing each of the filters in the set, and the state machine 423 can orchestrate changes in filter tuning settings in accordance with the programmed parameters in the memory 421.

For example, the memory 421 may be programmed with a plurality of filter states, where each of the filter states includes the parameters required to implement a corresponding filter. The parameters for a given filter state may define the switch control signal(s) required to select a pair of filters from the first and second filter banks 406-412 as well as the filter tuning control signal(s) for tuning one or more of the individual filters 414B-414N and 416B-416N.

By storing all of the required parameters and/or control signals in the memory 421 for implementing the filter states for a given application, the tunable filter 400 may be able to more quickly transition between different filter states. For example, without storing the parameters in the memory 421, the control circuitry 420 may need to receive all of the data required to define the parameters from an external source via the input pins 422, which can be time consuming and lead to a delay in transitioning the tunable filter from one filter setting to another filter setting. In one implementation, the control circuitry 420 may receive the parameters for a filter state via a serial peripheral interface (SPI) word, which may be relatively long and require a relatively long length of time for the entire SPI word to be received at the control circuitry 420.

In contrast, by storing the parameters for the set of filter states within the memory 421, the control circuitry 420 may only need to receive an indication of the next filter state to implement, which may be a significantly reduced amount of data to be received compared to the full set of parameters to implement the filter. In this manner, the control circuitry 420 can more quickly implement a filter state after in response to a received filter state input signal.

The memory 421 may be implemented as a random-access memory (RAM) or a read-only memory (ROM) or other non-volatile memory. For example, when the memory 421 is implemented as RAM, the memory 421 may be able to reprogram the filter states stored in the memory as required by the particular implementation. In contrast, when implemented as a ROM, the memory 421 may be able to implement the same set of filter states without needing to be reprogrammed after the control circuitry 420 is powered off. In some embodiments, the memory 421 may include both a RAM and a ROM, allowing the memory 421 to implement a set of filter states without programming the ROM portion and also allowing a set of filter states to be reprogrammed using the RAM portion.

The state machine 423 can be used to provide fast frequency up-down functionality without the need for reprogramming of the memory 421. For example, the state machine 423 may define a plurality of filter states for the tunable filter 400 as well as the allowed transitions between the filter states. Thus, the control circuitry 420 can receive an input signal with instructions to adjust the filter frequency up or down and the state machine 423 can provide the control signals (e.g., the switch control signal(s) and the filter tuning control signal(s)) for implementing the next filter state based on the input signal. With this functionality, the state machine 423 can be used to implement a change between filter states with as little as a single pulse to a dedicated one of the input pins 422, reducing the amount of data required to implement a change in the filter state of the tunable filter 400.

Figure 8A:
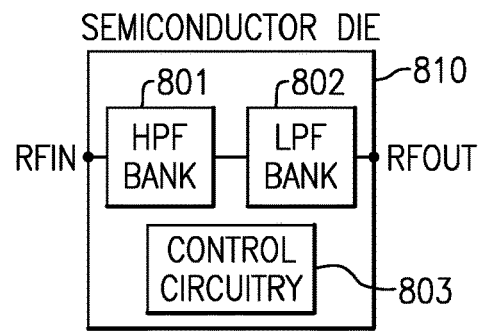
FIG. 8A is an embodiment of a semiconductor die including a tunable filter.

FIG. 8A is an embodiment of a semiconductor die 810 including a tunable filter. The semiconductor die 810 includes an RF input pin (RFIN) an RF output pin (RFOUT), a bank of selectable high-pass filters 801, a bank of selectable low-pass filters 802, and control circuitry 803.

In the illustrated embodiment, the bank of selectable high-pass filters 801 and the bank of selectable low-pass filters 802 are arranged in a cascade between the RF input pin (RFIN) and the RF output pin (RFOUT). The control circuitry 803 is configured to output control signals for selecting individual filters from the bank of selectable high-pass filters 801 and the bank of selectable low-pass filters 802.

Figure 8B:
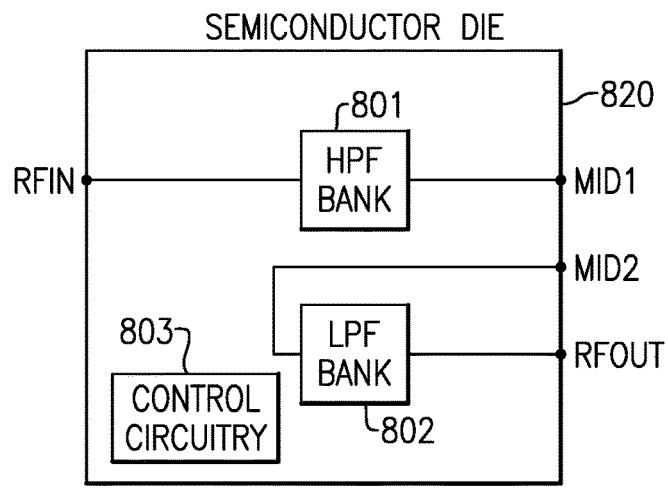
FIG. 8B is another embodiment of a semiconductor die including a tunable filter.

FIG. 8B is another embodiment of a semiconductor die 820 including a tunable filter. The semiconductor die 820 includes an RF input pin (RFIN), an RF output pin (RFOUT), a first midpoint pin (MID1), a second midpoint pin (MID2), a bank of selectable high-pass filters 801, a bank of selectable low-pass filters 802, and control circuitry 803.

In the illustrated embodiment, the bank of selectable high-pass filters 801 is electrically connected between the RF input pin (RFIN) and the first midpoint pin (MID1), while the bank of selectable low-pass filters 802 are electrically connected between the second midpoint pin (MID2) and the RF output pin (RFOUT).

By implementing the semiconductor die 820 in this manner, an off-chip connection can be used to connect the bank of selectable high-pass filters 801 to the bank of selectable low-pass filters 802. For example, such a connection can be direct (for instance, by a metal route) or through one or more RF components. Thus, enhanced flexibility is achieved.

Figure 8C:
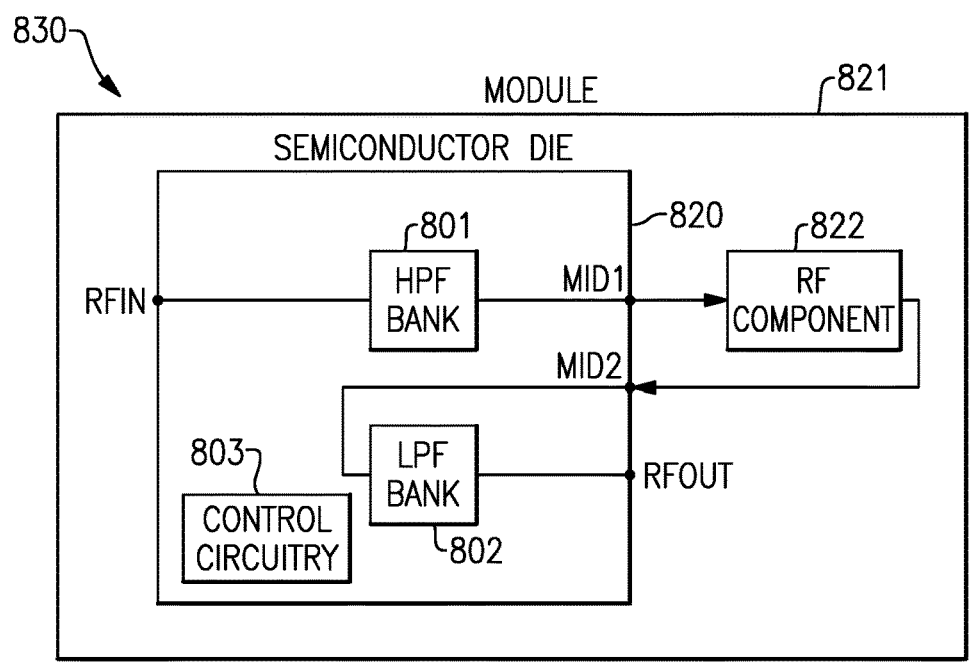
FIG. 8C is an embodiment of a module including the semiconductor die of FIG. 8B.

FIG. 8C is an embodiment of a module 820 including the semiconductor die 830 of FIG. 8B. The module 820 includes a module substrate 821 on which the semiconductor die 830 and one or more RF components 822 are attached. As shown in FIG. 8C, the bank of selectable high-pass filters 801 is electrically connected to the bank of selectable high-pass filters 802 by way of an off-chip signal path 823 from the first midpoint pin (MID1), through the one or more RF components 822, and to the second midpoint pin (MID2).

Figure 9A:
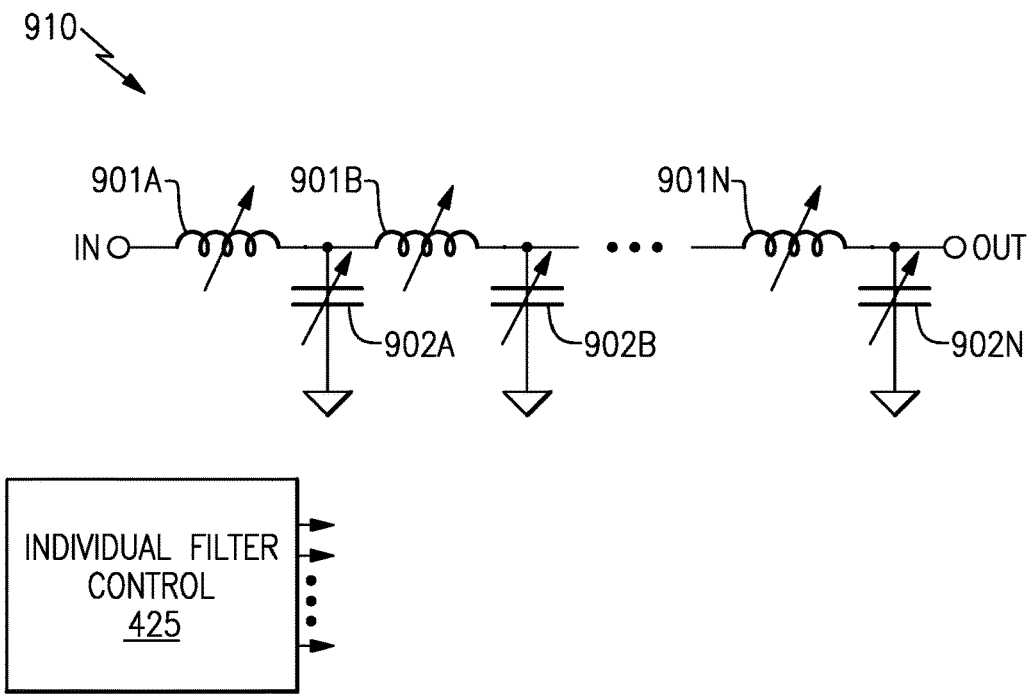
FIG. 9A is an embodiment of a controllable low-pass filter.

FIG. 9A is an embodiment of a controllable low-pass filter 910. The controllable low-pass filter 910 includes series inductors 901A, 901B, . . . 901N and shunt capacitors 902A, 902B, . . . 902N electrically connected between an input (IN) and an output (OUT) as depicted. Any number of inductors and/or capacitors can be included.

The individual filter control circuitry 425 (which can be included in the control circuitry 420 of FIG. 4) can adjust the component values of any combination of the depicted components to achieve tuning. Moreover, such tuning can be specific to a particular low-pass filter of a bank of selectable low-pass filters. Control of component values can be analog (for instance, when the shunt capacitors are implemented as varactors) and/or digital (for instance, when a bank of selectable inductors or a bank of selectable capacitors is used to implement a particular inductor or capacitor).

Figure 9B:
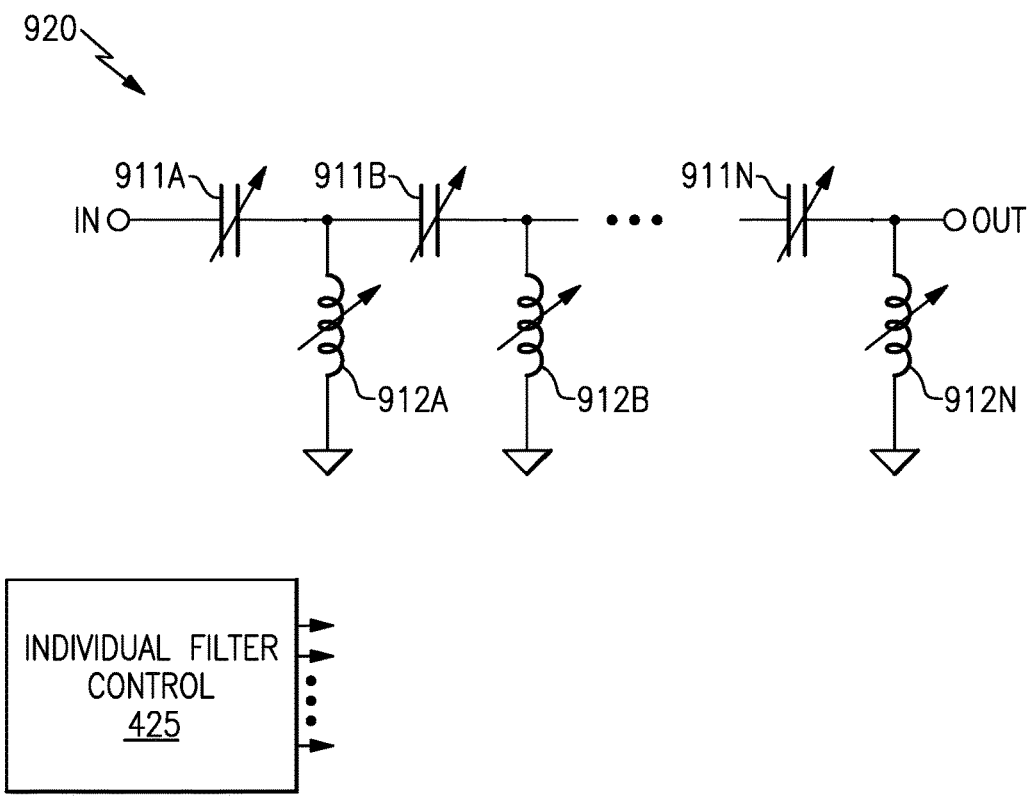
FIG. 9B is an embodiment of a controllable high-pass filter.

FIG. 9B is an embodiment of a controllable high-pass filter 920. The controllable high-pass filter 920 includes series capacitors 911A, 911B, . . . 911N and shunt inductors 912A, 912B, . . . 912N electrically connected between an input (IN) and an output (OUT) as depicted. Any number of inductors and/or capacitors can be included.

The individual filter control circuitry 425 (which can be included in the control circuitry 420 of FIG. 4) can adjust the component values of any combination of the depicted components to achieve tuning. Moreover, such tuning can be specific to a particular high-pass filter of a bank of selectable high-pass filters.

Applications

Devices employing the above described schemes can be implemented into various electronic devices. Examples of electronic devices include, but are not limited to, RF communication systems, consumer electronic products, electronic test equipment, communication infrastructure, etc. For instance, a power amplifier can be used in a wide range of RF communication systems, including, but not limited to, base stations, mobile devices (for instance, smartphones or handsets), laptop computers, tablets, and wearable electronics. The teachings herein are applicable to RF communication systems operating over a wide range of frequencies and bands, including those using time division duplexing (TDD) and/or frequency division duplexing (FDD).

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A tunable filter with controllable cutoff frequencies, wherein the tunable filter comprises:
   a first filter bank including a plurality of high-pass filters each having a different cutoff frequency;
   a second filter bank including a plurality of low-pass filters each having a different cutoff frequency;
   a first pair of switches configured to select a first filter chosen from the first filter bank;
   a second pair of switches configured to select a second filter chosen from the second filter bank; and
   control circuitry configured to generate a plurality of filter tuning control signals configured to individually tune at least a portion of the plurality of high-pass filters and to individually tune at least a portion of the plurality of low-pass filters,
   wherein the tunable filter operates with a first cutoff frequency of the first filter and with a second cutoff frequency of the second filter, and
   wherein the first filter bank further includes an all-pass filter and the second filter bank further includes an all-pass filter.

2. The tunable filter of claim 1, wherein the first filter bank comprises a first plurality of unselected filters not chosen by the first pair of switches, wherein the control circuitry is further configured to tune a cutoff frequency of at least a portion of the first plurality of unselected filters to reduce reentry noise.

3. The tunable filter of claim 1, wherein the tunable filter operates as a selected filter type chosen from a plurality of filter types including an all-pass filter type, a low-pass filter type, and a high-pass filter type.

4. The tunable filter of claim 1, wherein the control circuitry is further configured to generate a plurality of switch control signals configured to control the first pair of switches and the second pair of switches.

5. The tunable filter of claim 4, wherein the control circuitry includes a state machine configured to store a plurality of filter states and allowed transitions between the filter states, each of the filter states including a plurality of parameters for implementing the corresponding filter state, the control circuitry further configured to generate the switch control signals and the plurality of filter tuning control signals based on the parameters and the allowed transition states.

6. The tunable filter of claim 4, wherein the control circuitry includes a memory configured to store a plurality of filter states, each of the filter states including a plurality of parameters for implementing the corresponding filter state, the control circuitry further configured to generate the switch control signals and the plurality of filter tuning control signals based on the plurality of parameters.

7. The tunable filter of claim 6, wherein the control circuitry is further configured to receive a serial peripheral interface (SPI) signal including instructions to implement one of the plurality of filter states.

8. A method of tunable filtering, the method comprising:
   selecting a first filter from a first filter bank of a tunable filter using a first pair of switches of the tunable filter, the first filter bank comprising a plurality of high-pass filters; and
   selecting a second filter from a second filter bank of the tunable filter using a second pair of switches of the tunable filter, the second filter bank comprising a plurality of low-pass filter;
   generating, using control circuitry, a plurality of filter tuning control signals to tune a plurality of cutoff frequencies of the high-pass filters and the low-pass filters;
   filtering a radio frequency signal using the tunable filter, wherein the filtering is based on a first cutoff frequency of the first filter and on a cutoff frequency of the second filter;
   storing, in a memory of the control circuitry, a plurality of filter states, each of the filter states including a plurality of parameters for implementing the corresponding filter state; and
   generating, using the control circuitry, a plurality of switch control signals to control the first pair of switches and the second pair of switches and a plurality of filter tuning control signals to tune a plurality of cutoff frequencies of the high-pass filters and of the low-pass filters based on the parameters of the filter states stored in the memory.

9. The method of claim 8, wherein the first filter bank further includes a first all-pass filter and the second filter bank further includes a second all-pass filter, the method further comprising selecting at least one of the first all-pass filter or the second all-pass filter.

10. The method of claim 8, further comprising tuning, using the control circuitry, a cutoff frequency of one or more unselected high-pass filters of the first filter bank and a cutoff frequency of one or more unselected low-pass filters of the second filter bank to reduce reentry noise.

11. The method of claim 8, wherein the first filter bank further includes an all-pass filter and the second filter bank further includes an all-pass filter.

12. The method of claim 8, further comprising:
   storing, in a state machine, a plurality of allowed transitions between the filter states, wherein the generating of the switch control signals and the plurality of filter tuning control signals is further based on the allowed transition states stored in the state machine.

13. A radio frequency (RF) module comprising:
a module substrate; and
a semiconductor die attached to the module substrate, wherein the semiconductor die comprises:
 a first filter bank including a plurality of high-pass filters each having a different cutoff frequency;
 a second filter bank including a plurality of low-pass filters each having a different cutoff frequency;
 a first pair of switches configured to select a first filter chosen from the first filter bank, wherein the first filter has a first cutoff frequency;
 a second pair of switches configured to select a second filter chosen from the second filter bank, wherein the second filter has a second cutoff frequency; and
 control circuitry configured to generate a plurality of filter tuning control signals configured to individually tune at least a portion of the plurality of high-pass filters and to individually tune at least a portion of the plurality of low-pass filters,
 wherein the first filter and the second filter are electrically connected in series by way of an off-chip path on the module substrate.

14. The RF module of claim 13, wherein the first filter and the second filter are electrically connected in series on the semiconductor die.

15. The RF module of claim 13, wherein the off-chip path includes at least one RF component attached to the module substrate.

16. The RF module of claim 13, wherein the first filter bank comprises a first plurality of unselected filters not chosen by the first pair of switches, wherein the control circuitry is further configured to tune a cutoff frequency of at least a portion of the first plurality of unselected filters to reduce reentry noise.

17. The RF module of claim 13, wherein the control circuitry is further configured to generate a plurality of switch control signals configured to control the first pair of switches and the second pair of switches.

18. The RF module of claim 17, wherein the control circuitry includes a memory configured to store a plurality of filter states, each of the filter states including a plurality of parameters for implementing the corresponding filter state, the control circuitry further configured to generate the switch control signals and the plurality of filter tuning control signals based on the plurality of parameters.

19. The RF module of claim 18, wherein the control circuitry is further configured to receive a serial peripheral interface (SPI) signal including instructions to implement one of the plurality of filter states.

20. The RF module of claim 17, wherein the control circuitry includes a state machine configured to store a plurality of filter states and allowed transitions between the filter states, each of the filter states including a plurality of parameters for implementing the corresponding filter state, the control circuitry further configured to generate the switch control signals and the plurality of filter tuning control signals based on the parameters and the allowed transition states.

* * * * *